United States Patent [19]
Kravitz et al.

[11] 4,068,255
[45] Jan. 10, 1978

[54] MESA-TYPE HIGH VOLTAGE SWITCHING INTEGRATED CIRCUIT

[75] Inventors: Bernard L. Kravitz, Forest Hills; George R. Seaton, Northport, both of N.Y.

[73] Assignee: Dionics, Inc., Westbury, N.Y.

[21] Appl. No.: 753,776

[22] Filed: Dec. 23, 1976

Related U.S. Application Data

[63] Continuation-in-part of Ser. No. 622,966, Oct. 16, 1975, Pat. No. 4,001,866, which is a continuation-in-part of Ser. No. 499,534, Aug. 22, 1974, Pat. No. 3,918,083.

[51] Int. Cl.² .............................................. H01L 29/06
[52] U.S. Cl. ........................................ 357/56; 357/55; 357/49; 357/46; 357/30
[58] Field of Search ...................... 357/56, 55, 49, 46, 357/30

[56] References Cited

U.S. PATENT DOCUMENTS

| | | | |
|---|---|---|---|
| 3,112,411 | 11/1963 | Cook, Jr. | 307/88.5 |
| 3,211,972 | 10/1965 | Kilby | 317/235 |
| 3,222,610 | 12/1965 | Evans | 330/38 |
| 3,423,651 | 1/1969 | Legat | 317/235 |
| 3,675,161 | 7/1972 | Teramoto | 332/16 R |
| 3,918,083 | 11/1975 | Kravitz | 357/39 |
| 3,970,843 | 1/1976 | Dumas | 250/211 J |
| 4,001,866 | 1/1977 | Kravitz | 357/39 |
| 4,001,867 | 1/1977 | Kravitz | 357/39 |

*Primary Examiner*—Martin H. Edlow
*Attorney, Agent, or Firm*—James J. Burke

[57] ABSTRACT

The voltage characteristics of switching integrated circuits of the type disclosed in U.S. Patent No. 3,918,083 are improved by employing a mesa-type etch to physically separate the four vertical transistors. Interconnection may be carried out by wire bonding respective collector and emitter areas or, preferably, passivating materials are used to fill the etched grooves and interconnection is carried out by vapor deposition (e.g. planar) techniques.

9 Claims, 6 Drawing Figures

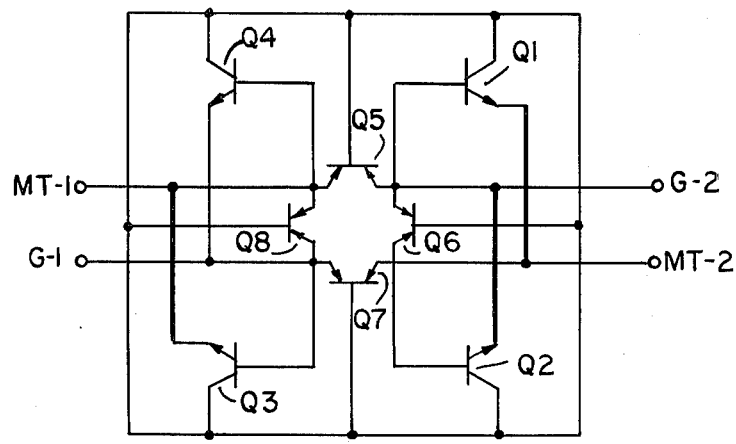
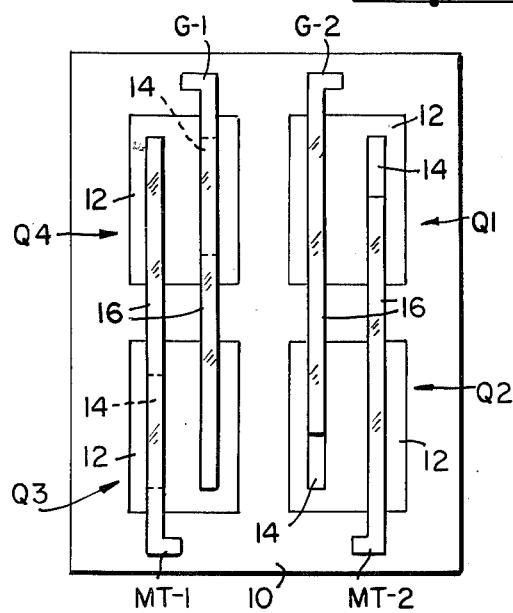
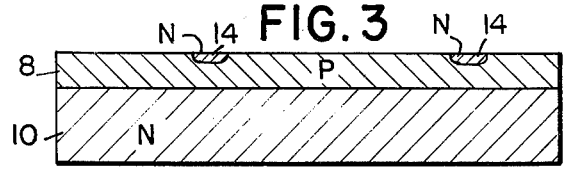
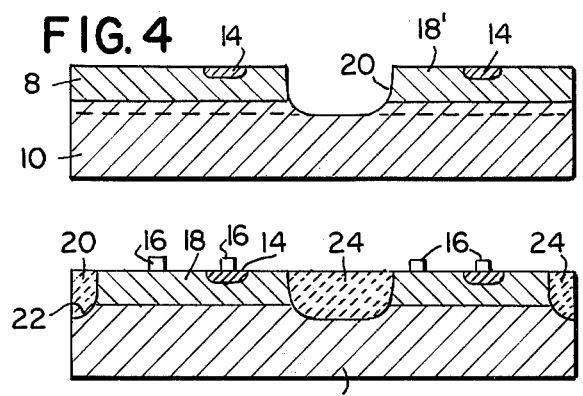
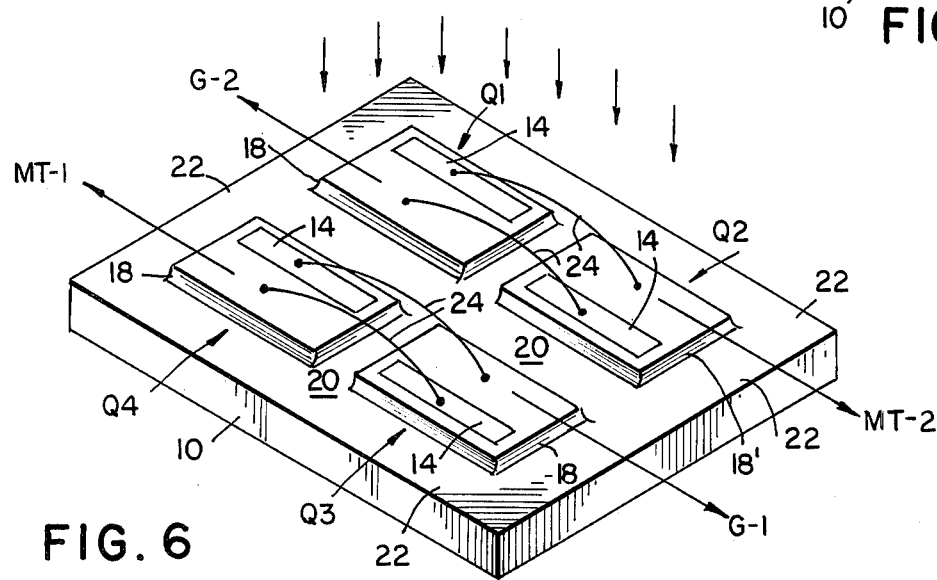

MESA-TYPE HIGH VOLTAGE SWITCHING INTEGRATED CIRCUIT

RELATED APPLICATIONS

The present application is a continuation-in-part of U.S. application Ser. No. 622,966, filed Oct. 16, 1975 (now U.S. Pat. No. 4,001,866 issued Jan. 4, 1977), which is in turn a continuation-in-part of U.S. application Ser. No. 499,534, filed Aug. 22, 1974, now U.S. Pat. No. 3,918,083, issued Nov. 4, 1975.

BACKGROUND OF THE INVENTION

In the aforesaid U.S. Pat. No. 3,918,083, there is disclosed a planar integrated circuit with bilateral switching capability. More particularly, the circuit comprises four vertical transistors having a common collector, with four emitter-base leads between adjacent pairs of transistors. The effective circuit is a lateral triac comprising eight transistors in a novel transistor bridge construction, and having all active junctions reaching a single surface. Because of its symmetrical construction, either a light-generated photocurrent or a gate current applied across one of two gate terminals and an associated main terminal, may be used to trigger the device and control an ac circuit. With the particular two-stage base diffusion disclosed in U.S. Pat. No. 3,920,493, issued Nov. 18, 1975, and assigned to the same assignee as the instant application, ac line voltages of 120 volts RMS may be controlled. Because devices of the type described are, effectively, planar, photosensitive triacs, we have named them "photracs".

Historically, high-power semiconductive devices have been large, discrete devices with junctions reaching a passivated edge rather than a major surface. The patent of Blicher et al, U.S. Pat. No. 3,427,515 may be considered representative of many in this area.

The present invention represents a combination of planar and mesa technologies, one which carries the voltage capabilities of the purely planar photrac into the 400 volt range.

OBJECTS OF THE INVENTION

A general object of the present invention is to provide a photrac of improved voltage capability.

Another object of the present invention is to provide a high-voltage photrac, combining planar and mesa technologies.

A still further object of the present invention is to provide a bilateral, switching integrated circuit capable of gate triggering or light triggering for ac circuit control in the 400 volt range.

Various other objects and advantages of the invention will become clear from the following description of embodiments thereof, and the novel features will be particularly pointed out in connection with the appended claims.

THE DRAWINGS

Reference will hereinafter be made to the accompanying drawings, in which:

FIG. 1 is a schematic circuit diagram of the basic photrac, with external connections shown in heavy lines;

FIG. 2 is a plan view of a basic photrac showing the four vertical transistors $Q_1 - Q_4$ and the external interconnections;

FIG. 3 is a cross-sectional elevation of a mesa-type photrac of the present invention after diffusion but prior to etching;

FIG. 4 is a cross sectional elevation of the device of FIG. 3 after etching;

FIG. 5 is a cross-sectional elevation of the device of FIG. 4 after passivation and application of leads; and FIG. 6 is a perspective view of a mesa photrac interconnected by wire bonding.

All of the drawings are simplified and not in true proportion, so as to emphasize the features of the present invention.

DESCRIPTION OF EMBODIMENTS

Understanding of the invention will be facilitated by preliminary consideration of the basic photrac construction, and attention is directed to FIGS. 1 and 2.

The basic photrac comprises four vertical NPN transistors $Q_1 - Q_4$ in a common collector configuration. With this construction, four lateral PNP transistors $Q_5 - Q_8$ in common base configuration are formed inherently. With ordinary planar construction, however, all active junctions will reach a single surface. External connections are as follows: a first main terminal MT-1 is connected across the emitter of $Q_3$ and the base of $Q_4$. The second main terminal MT-2 is connected across the emitter of $Q_1$ and base of $Q_2$. Terminals for gate triggering, G-1, G-2, which are optional, are connected to the opposite emitter-base pairs. What the device looks like is shown in plan view in FIG. 2.

From FIG. 2 it is also apparent that construction of the basic photrac follows conventional planar technology, e.g. an N-type substrate 10 of silicon having suitable resistivity is masked, etched and four base zones 12 are diffused with a P-type impurity. The oxide is regrown, an emitter mask applied and etched and four emitter zones 14 of N-type impurities are diffused (it will be appreciated that conductivities can be reversed or modified procedures could be employed). Leads 16 are then applied in the conventional manner. Operation of the photrac and its applications are discussed in the aforesaid related patents.

In carrying out the present invention there is a significant difference early in the process: Rather than diffusing the base zones through a mask, a bulk diffusion is possible. Thus, as shown in FIG. 3 substrate 10 is bulk diffused to establish a P-layer 18. Thereafter, N-type emitter zones 14 are diffused in the same manner as described above in connection with FIG. 2.

Following regrowth of the oxide to cover the emitter diffusions, a cruciform etch mask is applied, and etching is carried out to remove the P-type base layer between and around the four emitter zones with the formation of four discrete bases 18, 18' etc. separated by a cruciform groove 20. Thus, the transistors $Q_1 - Q_4$ are separated by grooves 20 except for the common collector represented by substrate 10. By also etching the side portion 22, the area of the collector-base junctions that will "see" a light from directly above (arrows), as from an LED, is effectively doubled.

FIG. 6 also shows wire-bonded interconnections 24 to effect the same ends as leads 16 in FIG. 2. Main and gate terminals are illustrated schematically.

The embodiment of FIG. 6 is an operative, high-voltage mesa-type photrac, but those skilled in the art will appreciate that (1) best voltage capabilities will not be achieved without passivation, and (2) wire bonding as shown in FIG. 6 is difficult on such a small chip, is inherently expensive, and leads to reduced yields.

A preferred embodiment which overcomes the foregoing problems is illustrated in FIG. 5, and attention is directed thereto. As can be seen, the etched-away portions 20, 22 have been filled with a passivating material 24, and conventional (planar) vapor-deposited leads 16, the same as used in the basic photrac (FIG. 2) have been applied.

The passivating material 24 is conventional, and may be $SiO_2$, polycrystalline silicon, ceramic or glass. It is applied over the entire upper surface by conventional means, and the surface is then lapped down to expose the active areas. Regrowth of the oxide, opening interconnection holes and deposition of leads and terminal pads follows (for simplicity in the drawings, overlying $SiO_2$ has been omitted).

Considerations important in the basic photrac and other photosensitive devices (substrate material, doping levels, junction geometries, minimal light-blocking films, etc.) are also important in the mesa photracs, and the designer must take these into account. In addition, because the geometry of the grooves 20 will affect the operating characteristics of lateral PNP transistors $Q_4$-$Q_8$, the depth, slope and width of grooves 20 must be carefully controlled. As an obvious example, if grooves 20 were too deep the effective base "depth" of the lateral PNP's would exceed the minority carrier lifetime, with disastrous results. The same could happen if the grooves were too wide, or if the transister were not symmetrically arranged in respective quadrants of the chip.

It will also be appreciated that while the invention has been described with reference to devices having a high-voltage capability but still in the 25 or 50 mil size range of conventional photracs, the size, and resulting voltage and power ratings, can be changed. While the foregoing has not been explored in detail, it is to be noted that photracs of the type described are extremely light sensitive, and the limits, in terms of power capability, that could still be light triggered, are not known.

Various other changes in the details, steps, materials, and arrangements of parts, which have been herein described and illustrated in order to explain the nature of the invention, may be made by those skilled in the art within the principle and scope of the invention as defined in the appended claims.

What is claimed is:

1. A mesa-photrac comprising:
    a body of semiconductive material of a first conductivity type having two major surfaces;
    four mesas in one said surface, each said mesa having an upper layer forming a base zone of opposite conductivity type material, and forming a PN junction with said body, said junction extending to the sides of said mesa;
    an emitter zone of said first conductivity type material located entirely within each said base zone and forming a PN junction reaching said one surface;
    said respective base and emitter zones forming with said body four mesa-type transistors sharing a common collector; and
    four conductive leads connecting base and emitter zones between adjacent pairs of said transistors.

2. The mesa-photrac as claimed in claim 1, wherein the collector-base junctions reaching the edges of said mesas are passivated.

3. The mesa-photrac as claimed in claim 2, wherein a passivating material fills the space between said mesas.

4. The mesa-photrac as claimed in claim 3, wherein said conductive leads are vapor deposited and overlay said transistors and passivating material.

5. The mesa photrac as claimed in claim 3, wherein said passivating material is selected from the group consisting of silicon dioxide, polycrystalline silicon, ceramic, and glass.

6. The mesa-photrac as claimed in claim 1, wherein said four transistors are symmetrically arranged in respective quadrants of said body.

7. The mesa-photrac as claimed in claim 1, and additionally comprising a pair of terminal pads connected to each said pair of leads.

8. The method of producing a mesa-photrac comprising:
    providing a body of semiconductive material of a first conductivity type and having two major surfaces;
    forming a layer of opposite conductivity-type material in one said surface, said layer forming a PN junction with said body;
    forming four separate zones of first conductivity type material entirely within said layer and having PN junctions reaching said one surface;
    etching said body in a general cruciform pattern to expose edges of said first-formed PN junction with the formation of four mesas;
    said four mesas and said body comprising four transistors in common collector configuration, said separate zones comprising emitters and the remainder of said one surface comprising bases; and
    attaching conductive leads between the emitters and bases of respective pairs of adjacent transistors.

9. The method as claimed in claim 8, and additionally comprising passivating the exposed junctions formed by said etching.

* * * * *